(12) United States Patent
Xie et al.

(10) Patent No.: US 8,835,244 B2
(45) Date of Patent: Sep. 16, 2014

(54) INTEGRATED CIRCUITS AND METHODS FOR FABRICATING INTEGRATED CIRCUITS HAVING METAL GATE ELECTRODES

(71) Applicants: GlobalFoundries, Inc., Grand Cayman (KY); International Business Machines Corporation, Armonk, NY (US)

(72) Inventors: Ruilong Xie, Niskayuna, NY (US); Chanro Park, Clifton Park, NY (US); Shom Ponoth, Gaithersburg, MD (US)

(73) Assignees: GlobalFoundries, Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/773,397

(22) Filed: Feb. 21, 2013

(65) Prior Publication Data

US 2014/0231885 A1 Aug. 21, 2014

(51) Int. Cl.
*H01L 21/8234* (2006.01)
*H01L 29/66* (2006.01)
*H01L 29/788* (2006.01)

(52) U.S. Cl.
CPC ........ *H01L 29/66477* (2013.01); *H01L 29/788* (2013.01); *H01L 21/823437* (2013.01); *H01L 29/6653* (2013.01); *H01L 29/66545* (2013.01); *H01L 21/823468* (2013.01)
USPC .......................................... 438/230; 257/310

(58) Field of Classification Search
CPC ................. H01L 21/823437; H01L 21/82345; H01L 21/823468; H01L 29/6653; H01L 29/66545
USPC .......................................... 257/310; 438/230
See application file for complete search history.

(56) References Cited

U.S. PATENT DOCUMENTS

| | | | |
|---|---|---|---|
| 8,592,265 B2 * | 11/2013 | Kim et al. ...................... | 438/184 |
| 2006/0008973 A1 * | 1/2006 | Phua et al. ...................... | 438/231 |
| 2011/0127589 A1 * | 6/2011 | Chen et al. ..................... | 257/288 |
| 2012/0217590 A1 * | 8/2012 | Babich et al. .................. | 257/410 |
| 2013/0092986 A1 * | 4/2013 | Wang et al. .................... | 257/288 |
| 2013/0187236 A1 * | 7/2013 | Xie et al. ....................... | 257/369 |

\* cited by examiner

*Primary Examiner* — Allan R Wilson
(74) *Attorney, Agent, or Firm* — Ingrassia Fisher & Lorenz, P.C.

(57) ABSTRACT

Integrated circuits and methods for fabricating integrated circuits are provided. In an exemplary embodiment, a method for fabricating integrated circuits includes providing a sacrificial gate structure over a semiconductor substrate. The sacrificial gate structure includes two spacers and sacrificial gate material between the two spacers. The method recesses a portion of the sacrificial gate material between the two spacers. Upper regions of the two spacers are etched while using the sacrificial gate material as a mask. The method includes removing a remaining portion of the sacrificial gate material and exposing lower regions of the two spacers. A first metal is deposited between the lower regions of the two spacers. A second metal is deposited between the upper regions of the two spacers.

20 Claims, 5 Drawing Sheets

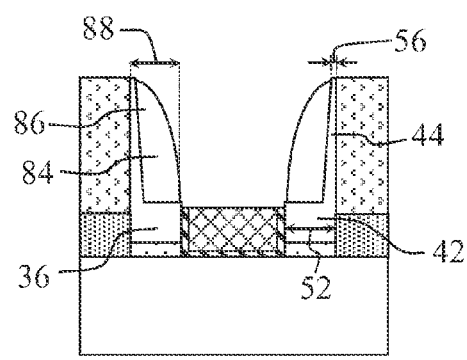
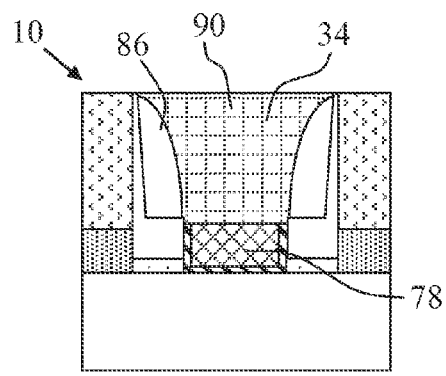
FIG. 10       FIG. 11
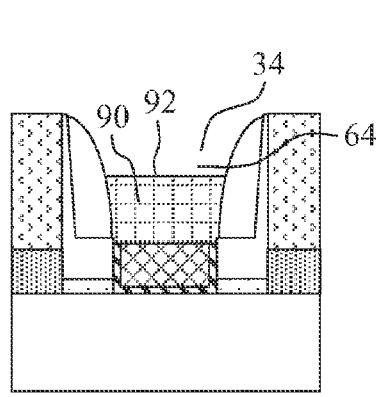
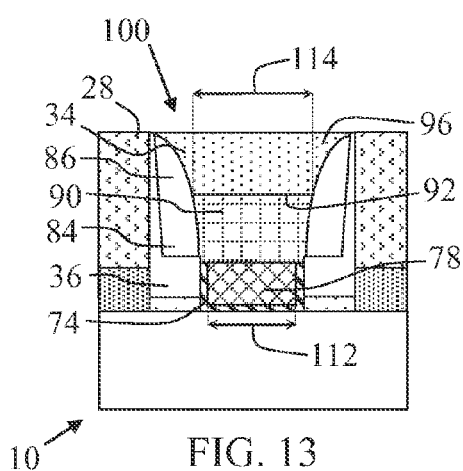
FIG. 12       FIG. 13

INTEGRATED CIRCUITS AND METHODS FOR FABRICATING INTEGRATED CIRCUITS HAVING METAL GATE ELECTRODES

TECHNICAL FIELD

The present disclosure generally relates to integrated circuits and methods for fabricating integrated circuits, and more particularly, relates to integrated circuits and methods for fabricating integrated circuits having metal gate electrodes.

BACKGROUND

As the critical dimensions of integrated circuits continue to shrink, the fabrication of gate electrodes for complementary metal-oxide-semiconductor (CMOS) transistors has advanced to replace silicon dioxide and polysilicon with high-k dielectric material and metal. A replacement metal gate process is often used to form the gate electrode. A typical replacement metal gate process begins by forming a sacrificial gate oxide material and a sacrificial gate between a pair of spacers on a semiconductor substrate. After further processing steps, such as an annealing process, the sacrificial gate oxide material and sacrificial gate are removed and the resulting trench is filled with a high-k dielectric and one or more metal layers. The metal layers can include workfunction metals as well as fill metals.

Processes such as atomic layer deposition (ALD), chemical vapor deposition (CVD), physical vapor deposition (PVD), electroplating (EP), and electroless plating (EL) may be used to deposit the one or more metal layers that form the metal gate electrode. Unfortunately, as critical dimensions decrease, issues such as trench overhang and void formation become more prevalent and pose a greater challenge to overcome. This is due to the smaller gate dimensions. Specifically, at smaller dimensions, the aspect ratio of the trench used to form the metal gate electrode becomes higher as the metal layers are deposited and form on the trench sidewalls. Metallization of high aspect ratio trenches quite often results in void formation.

Additional issues arise with lateral scaling, for example, lateral scaling presents issues for the formation of contacts. When the contacted gate pitch is reduced to about 64 nanometers (nm), contacts cannot be formed between the gate lines while maintaining reliable electrical isolation properties between the gate line and the contact. Self-aligned contact (SAC) methodology has been developed to address this problem. Conventional SAC approaches involve recessing the replacement metal gate structure, which includes depositing both workfunction metal liners (e.g. TiN, TaN, TaC, TiC, and TiAlN) and a fill or conducting metal (e.g., W, Al, etc.), followed by a dielectric cap material deposition and chemical mechanical planarization (CMP). To set the correct workfunction for the device, thick work function metal liners may be required (e.g., a combination of different metals such as TiN, TiC, TaC, TiC, or TiAlN with a total thickness of more than 7 nm). As gate length continues to scale down, for example for sub-15 nm gates, the replacement gate structure is so narrow that it will be "pinched-off" by the work function metal liners, leaving little or no space remaining for the lower-resistance fill metal. This will cause high resistance issue for devices with small gate lengths, and will also cause problems in the SAC replacement gate metal recess process.

Accordingly, it is desirable to provide improved integrated circuits and methods for fabricating improved integrated circuits having metal gate electrodes. Also, it is desirable to provide methods for fabricating integrated circuits with metal gate electrodes that avoid high aspect ratios in trenches during metal deposition processes. Further, it is desirable to provide methods for fabricating integrated circuits that provide techniques for depositing metal layers in trenches that inhibit void formation. Further, it is desirable to provide methods for the fabrication of integrated circuits that integrate both metal replacement gates and self-aligned contacts with workfunction metal liner recess compatibility. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In one embodiment, a method for fabricating an integrated circuit includes providing a sacrificial gate structure over a semiconductor substrate. The sacrificial gate structure includes two spacers and sacrificial gate material between the two spacers. The method recesses a portion of the sacrificial gate material between the two spacers. Upper regions of the two spacers are etched while using the sacrificial gate material as a mask. The method includes removing a remaining portion of the sacrificial gate material and exposing lower regions of the two spacers. A first metal is deposited between the lower regions of the two spacers. A second metal is deposited between the upper regions of the two spacers.

In another embodiment, a method for fabricating an integrated circuit includes forming two spacers over a semiconductor substrate. The two spacers bound a trench having a lower portion, an upper portion, a boundary between the lower portion and the upper portion, and a top. The lower portion has a first width, the upper portion has a second width at the boundary greater than the first width, and the upper portion has an increasing width from the boundary to the top. The method includes depositing a first metal in the lower portion of the trench and depositing a second metal in the upper portion of the trench.

In another embodiment, an integrated circuit is provided. The integrated circuit includes a semiconductor substrate and a metal gate electrode structure overlying the semiconductor substrate. The metal gate electrode structure includes a workfunction metal having a first width. The metal gate electrode structure further includes a fill metal overlying the workfunction metal and having a second width greater than the first width.

BRIEF DESCRIPTION OF THE DRAWINGS

Embodiments of integrated circuits and methods for fabricating integrated circuits having metal gate electrodes will hereinafter be described in conjunction with the following drawing figures, wherein like numerals denote like elements, and wherein:

FIGS. 10-13 are cross-sectional side views of the portion of the integrated circuit of FIG. 9 in accordance with an embodiment for depositing a second metal to form a metal gate electrode.

DETAILED DESCRIPTION

The following detailed description is merely exemplary in nature and is not intended to limit the integrated circuits or the methods for fabricating integrated circuits claimed herein. Furthermore, there is no intention to be bound by any expressed or implied theory presented in the preceding technical field, background or brief summary, or in the following detailed description.

Integrated circuits and methods for fabricating integrated circuits having metal gate electrodes are provided that avoid issues faced by conventional processes for forming metal gate electrodes. For example, the methods contemplated herein provide for the formation of integrated circuits with metal gate electrodes without voids. Specifically, the methods herein avoid the occurrence of high aspect ratios in trenches during metal deposition. To avoid high aspect ratios, a trench is formed with a lower portion having a relatively smaller width and an upper portion having a relatively larger width. Further, the upper portion may have a tapered width that increases from the boundary with the lower portion to the top of the upper portion, i.e., it expands upwardly. A first metal deposition process can fill the lower portion with a first metal without creating a high aspect ratio as the first metal forms on the sidewalls bounding the upper portion. Further, a second deposition process can form a second metal over the first metal and in the upper region without encountering or creating a high aspect ratio. As a result, overhangs and voids are not formed and the resulting metal gate electrode exhibits better capacitance performance due to the improved deposition of metals.

FIGS. 1-9 illustrate partially completed integrated circuits and steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components shown in the illustrations may be representative of multiple components.

Figure 1:
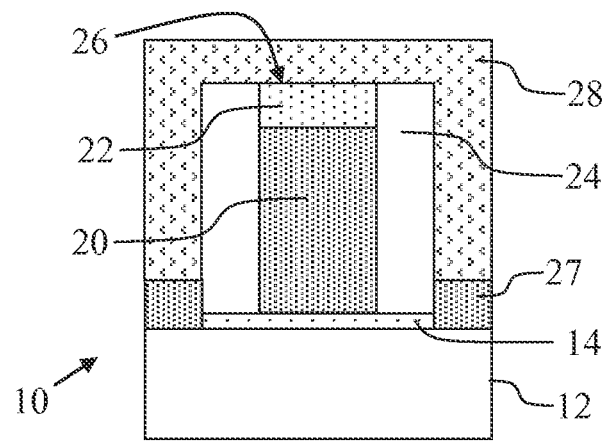
FIGS. 1-9 are cross-sectional side views of a portion of an integrated circuit including a first metal formed between spacers, and method steps for fabricating an integrated circuit in accordance with various embodiments herein.

In FIG. 1, in an exemplary embodiment, a method for fabricating an integrated circuit 10 begins by providing a semiconductor substrate 12. The semiconductor substrate 12 is preferably a silicon substrate (the term "silicon substrate" encompassing the relatively pure silicon materials typically used in the semiconductor industry as well as silicon admixed with other elements, such as germanium and the like). Semiconductor substrate 12 can be a bulk silicon wafer or a silicon-on-insulator wafer including a thin layer of silicon overlying an intermediate insulating layer that is, in turn, supported by a silicon carrier wafer. The substrate could be either planar or 3-dimensional, such as FINFET or nanowire.

As shown in FIG. 1, in an exemplary embodiment, a sacrificial gate oxide layer 14 is formed over the semiconductor substrate 12. As used herein, the term "over" encompasses the words "on" and "overlying". In the illustrated embodiment, the sacrificial gate oxide layer 14 is formed directly on the semiconductor substrate 12, although it is contemplated herein that an interfacial layer may underlie sacrificial gate oxide layer 14. An exemplary sacrificial gate oxide layer 14 is a layer of silicon oxide that is thermally grown by exposing the semiconductor substrate 12 to oxygen or is deposited, such as by chemical vapor deposition (CVD).

In FIG. 1, a layer of sacrificial gate material 20 is deposited over the sacrificial gate oxide layer 14. In an exemplary embodiment, the sacrificial gate material 20 may be polysilicon or amorphous silicon. As shown, a hard mask 22 is deposited over the sacrificial gate material 20. An exemplary hard mask 22 is silicon nitride. Using conventional lithography and etching steps, the hard mask 22 and sacrificial gate material 20 are sequentially patterned. Subsequently, a spacer-forming material is deposited over the hard mask 22 and the sacrificial gate material 20 and is anisotropically etched to form spacers 24. The hard mask 22, sacrificial gate material 20, sacrificial gate oxide layer 14 under the sacrificial gate material 20, and spacers 24 are considered to form a sacrificial gate structure 26. After conventional processing, such as epitaxial formation of source/drain regions 27 and ion implantation and annealing steps, an interlayer dielectric material 28 is deposited over the sacrificial gate structure 26 and semiconductor substrate 12. The interlayer dielectric material 28 may be silicon dioxide, silicon nitride, or a low-k material.

Figure 2:
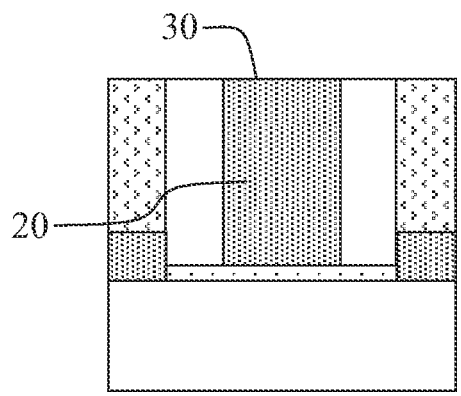
Figure 3:
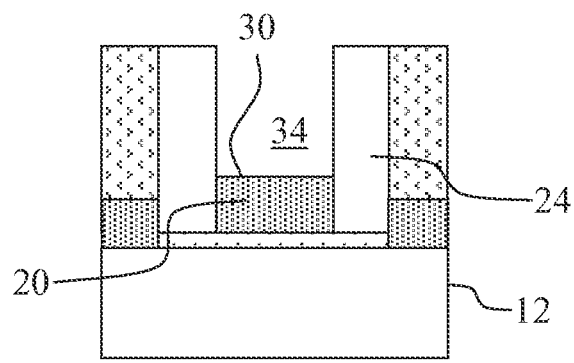

In FIG. 2, a planarization or polishing process, such as chemical mechanical planarization (CMP), is performed to expose a top surface 30 of the sacrificial gate material 20. As used herein, "top" and "upper" describe the orientation and/or location of a feature or element within the consistent but arbitrary frame of reference illustrated by the drawings. Specifically, the hard mask 22 is removed to expose the top surface 30 of the sacrificial gate material 20. In FIG. 3, the method continues by recessing a portion of the sacrificial gate material 20 between the two spacers 24. As a result, the top surface 30 of the sacrificial gate material 20 is repositioned forming a trench 34 between the spacers 24. In an exemplary embodiment, the top surface 30 is repositioned to a selected depth in the trench, i.e., a selected height above the semiconductor substrate 12, where a metal, such as a workfunction metal, is intended to be positioned later in the process as described below. The sacrificial gate material 20 may be removed with any appropriate etch technology, such as with a reactive ion etch.

Figure 4:
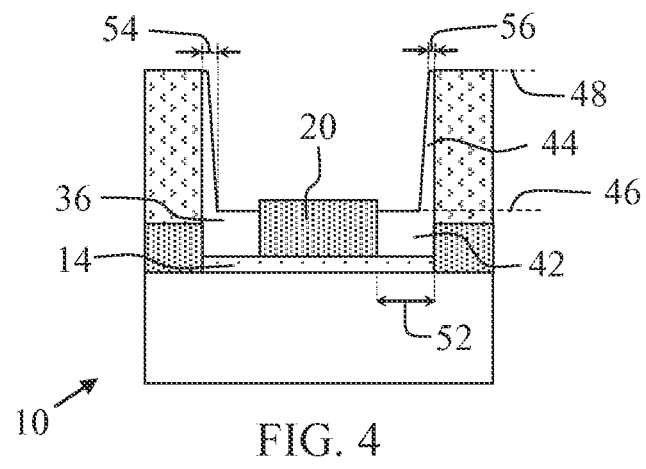

FIG. 4 illustrates further processing of the partially completed integrated circuit 10 with the spacers 24 partially etched to form selectively shaped spacers 36. In an exemplary embodiment, the spacers 24 are first etched anisotropically and then are etched isotropically to obtain the selectively shaped spacers 36. An exemplary anisotropic etching process is by a dry plasma reactive ion etch and an exemplary isotropic etching process can be a hot phosphorus wet etch. Alternatively, the partially completed integrated circuit of FIG. 4 can be obtained by totally removing the spacers 24, such as by an isotropic etch, depositing a liner layer, and anisotropically etching the liner layer to form the selectively shaped spacers 36. In an exemplary alternate embodiment the liner layer is silicon nitride.

In FIG. 4, each selectively shaped spacer 36 includes a lower region 42 and an upper region 44. The lower region 42 and the upper region 44 of each selectively shaped spacer 36 abut at a junction along a boundary plane 46. Further, the upper region 44 extends from the boundary plane 46 to a top plane 48. As shown, each lower region 42 has a substantially uniform thickness, indicated by double-headed arrow 52. Each upper region 44 has a maximum thickness, indicated by arrows 54, at the boundary plane 46 and tapers to a minimum thickness, indicated by arrows 56, at the top plane 48. As shown, the maximum thickness 54 of each upper region 44 is less than the thickness 52 of the lower region 42.

Figure 5:
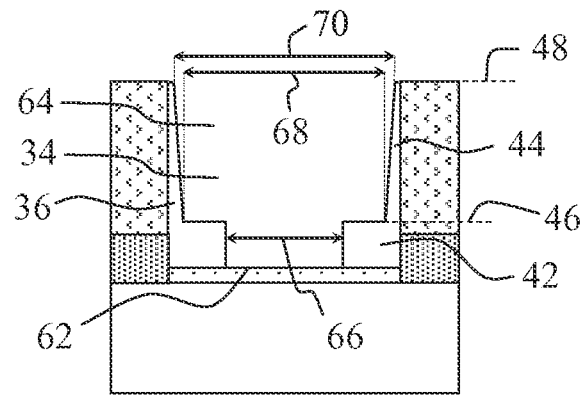

Following formation of the selectively shaped spacers 36, the sacrificial gate material 20 and the sacrificial gate oxide layer 14 under the sacrificial gate material 20 are removed, as illustrated in FIG. 5, such as by, for example, a hot ammonia poly wet removal followed by diluted HF oxide wet etch. The trench 34 now includes a lower portion 62 between the lower regions 42 of the selectively shaped spacers 36 and an upper portion 64 between the upper regions 44 of the selectively shaped spacers 36. Accordingly, the lower portion 62 of the trench 34 has a substantially uniform width, indicated by double-headed arrow 66, and the upper portion 64 of the trench 34 has a minimum width, indicated by double-headed arrow 68, at the boundary plane 46 and increases or expands moving upwardly to a maximum width, indicated by double-headed arrow 70, at the top plane 48.

The profiles of the selectively shaped spacers 36 and the corresponding shape of the trench 34 provide an improved aspect ratio for deposition of metal into the trench 34. Specifically, the reduced width 66 of the lower portion 62 of the trench 34 allows for complete filling of the lower portion 62 with a reduced amount of metal, reducing build-up of metal on the upper regions 44. Further, the tapered profile of the upper regions 44 of the selectively shaped spacers 36 also alleviates aspect ratio concerns and inhibits formation of overhangs and voids.

Figure 6:
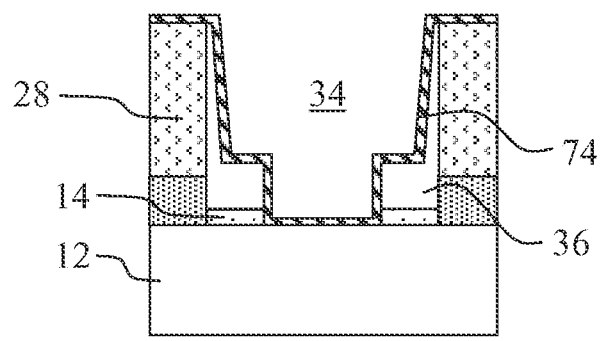
Figure 7:
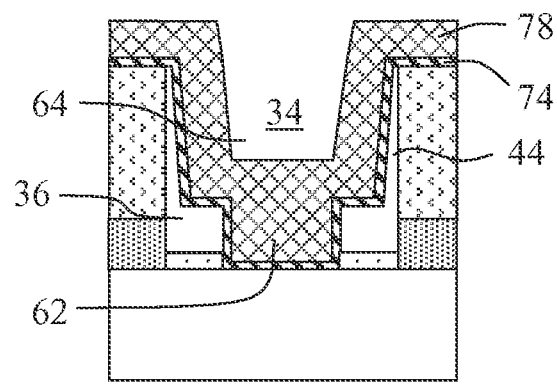

In FIG. 6, a high-k dielectric material 74 is deposited over the interlayer dielectric material 28 and within the trench 34 over the selectively shaped spacers 36, and the semiconductor substrate 12, such as by, for example atomic layer deposition (ALD). Then, as shown in FIG. 7, a metal 78 is deposited over the high-k dielectric material 74. As shown, the metal 78 fills the lower portion 62 of the trench 34. The metal 78 adhering to the upper regions 44 of the selectively shaped spacers 36 does not merge or form overhangs due to the reduced amount of metal 78 needed to fill the reduced width lower portion 62 of the trench 34, and due to the increased width and tapered profile of the upper portion 64 of the trench 34.

In an exemplary embodiment, the metal 78 is a workfunction metal selected for use in a NMOS or PMOS transistor. For example, the metal 78 may be tantalum nitride, tantalum, titanium nitride or other metals known for having appropriate workfunction values for use in NMOS or PMOS transistors. The exemplary metal 78 may be deposited by any appropriate process, such as, for example, atomic layer deposition (ALD).

Figure 8:
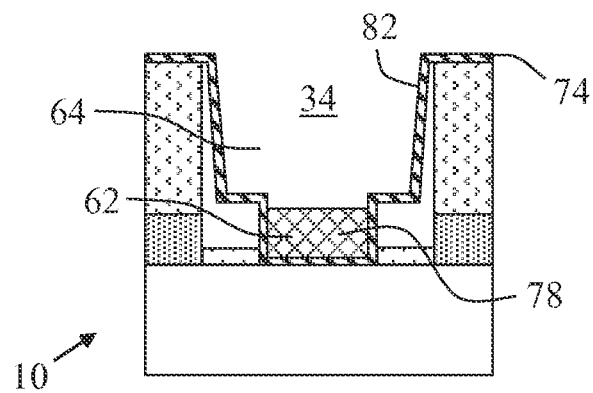

In FIG. 8, the metal 78 is isotropically etched and removed from the upper portion 64 of the trench 34. As shown, the metal 78 remains in the lower portion 62 of the trench 34. In an exemplary embodiment, an isotropic etch, such as an etch performed with a solution of $NH_4OH:H_2O_2:H_2O$ (standard clean 1), is used to recess the metal 78 and to expose a portion 82 of the high-k dielectric material 74.

Figure 9:
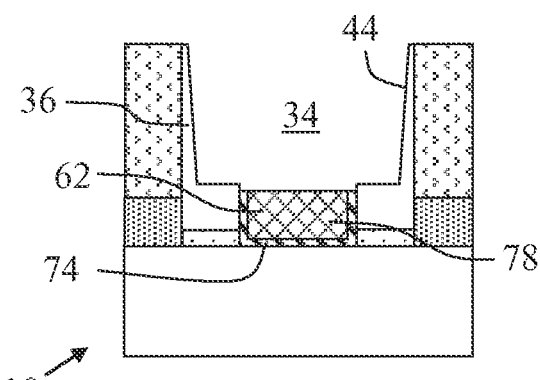

FIG. 9 illustrates an optional step of removing the exposed portion 82 of the high-k dielectric material 74. As a result, the upper regions 44 of the selectively shaped spacers 36 are exposed. While FIGS. 9-13 illustrate the exposed portion 82 of the high-k dielectric material 74 removed from the partially completely integrated circuit 10, in certain embodiments the exposed portion 82 of the high-k dielectric material 74 will remain. For the embodiment of FIGS. 14-17, described below, the exposed portion 82 of the high-k dielectric material 74 is removed.

FIG. 9 (or FIG. 8, if the exposed portion 82 of the high-k dielectric material 74 is left unetched) illustrates the partially completed integrated circuit 10 after formation of the metal 78 in the lower portion 62 of the trench 34. FIGS. 10-13 and FIGS. 14-17 illustrate different embodiments for forming a second metal over the metal 78 to complete the metal gate electrode.

In the embodiment of FIGS. 10-13, an additional spacer 84 is formed on and between the upper regions 44 of the selectively shaped spacers 36 in FIG. 10. An exemplary additional spacer 84 is silicon nitride that is deposited and etched anisotropically according to conventional processes. The additional spacers 84 and the selectively shaped spacers 36 may be considered to combine to form substitute spacers 86. As a result of the formation of substitute spacers 86, the upper region 44 of each substitute spacer 86 is provided with a redefined maximum thickness, indicated by double-headed arrow 88, greater than the maximum thickness 54 shown in FIG. 5. While the redefined maximum thickness 88 is illustrated as being slightly less than the thickness, indicated by double-headed arrow 52, of the lower region 42 of each selectively shaped spacer 36, it is contemplated that the redefined maximum thickness 88 be equal to the thickness 52 in certain embodiments. As shown, the additional spacer 84 tapers along a curve to zero so that the minimum thickness, indicated by arrows 56, remains equal to the thickness of the selectively shaped spacers 36 at the top plane 48 in FIG. 5.

In FIG. 11, another metal 90 is deposited in the trench 34 over the metal 78. In an exemplary embodiment, the metal 90 is deposited by chemical vapor deposition (CVD) to create an overburden above the trench 34 that is removed by a planarization process to form the partially completed integrated circuit 10 in FIG. 11. As shown, the metal 90 is formed in the trench 34 with no voids, as the profile of the trench 34 formed by the substitute spacer 86 provides a sufficiently low aspect ratio to inhibit void formation. An exemplary metal 90 is a fill metal that may be planarized easily, such as tungsten (with a thin TiN adhesion layer), aluminum, copper, or another low resistivity metal.

The metal 90 is recessed in FIG. 12 to lower its upper surface 92 to within the upper portion 64 of the trench 34. An exemplary process anisotropically etches the metal 90 with any suitable conventional plasma dry etch chemistry selective to the metal 90. In FIG. 13, a capping material is deposited over the metal 90, additional spacers 84, selectively shaped spacer 36, and interlayer dielectric material 28 to fill the trench 34 and create an overburden that is removed by planarization to form a cap 96. An exemplary cap 96 is formed from silicon nitride, though any appropriate material that can insulate the metal 90 in the trench 34 may be used. After forming the cap 96, the fabrication process may continue by performing well known contact formation steps and back-end-of-line (BEOL) process steps to complete the integrated circuit in a conventional manner.

As set forth above, and as partially shown in FIG. 13, a portion of an integrated circuit 10 is provided with a metal gate electrode structure 100 including metal 78 and metal 90. An exemplary metal 78 is a workfunction metal and an exemplary metal 90 is a fill metal, typically with lower resistance. The integrated circuit 10 further includes substitute spacers 86 (formed from spacers 36 and 84) surrounding the metal gate electrode structure 100. The integrated circuit 10 also includes a high-k dielectric material 74 positioned between at least the metal 78 and the selectively shaped spacers 36. As noted above, the high-k dielectric material 74 may also be positioned between the selectively shaped spacers 36 and the additional spacers 84. As shown, the metal 78 has a substantially uniform width, indicated by double-headed arrow 112, while the metal 90 has an upwardly expanding width, i.e., a width that increases from the boundary with the metal 78 to a maximum width, indicated by double-headed arrow 114, at the upper surface 92.

Figure 14:
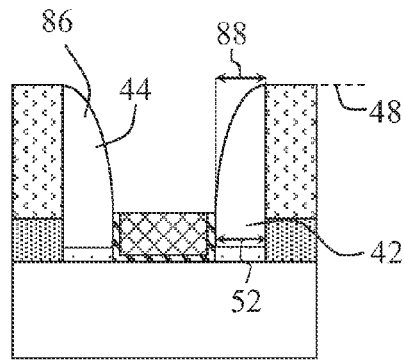
FIGS. 14-17 are cross-sectional side views of the portion of the integrated circuit of FIG. 9 in accordance with another embodiment for depositing a second metal to form a metal gate electrode.

The process illustrated in FIGS. 14-17 provides an alternate embodiment for forming the substitute spacers 86. In FIG. 14, the selectively shaped spacers 36 of the partially completed integrated circuit 10 of FIG. 9 are removed. Exemplary selectively shaped spacers 36 formed of silicon nitride may be isotropically etched using conventional etchant chemistry selective to silicon nitride. Then, substitute spacers 86 are formed by depositing a spacer-forming layer over the partially completed integrated circuit 10 and anisotropically etching the spacer-forming layer. An exemplary substitute spacer 86 is formed from a low-k dielectric material, such as SiBN, SiCBN, or similar material.

As a result of the formation of substitute spacers 86, the upper region 44 of each substitute spacer 86 is provided with a redefined maximum thickness 88 that is greater than the maximum thickness 54 shown in FIG. 5. In FIG. 14, the redefined maximum thickness 88 is illustrated as being substantially equal to the thickness 52 of the lower region 42, though it is contemplated that the redefined maximum thickness 88 be less than the thickness 52 in certain embodiments. As shown, each substitute spacer 86 tapers to a minimum thickness at the top plane 48.

Figure 15:
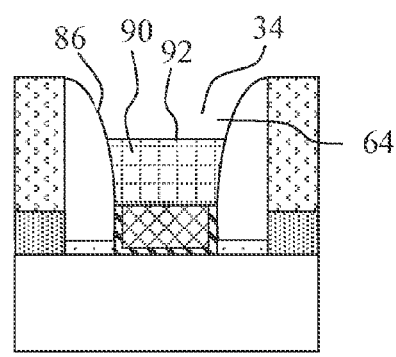

In FIG. 15, a lower resistance metal 90 is deposited in the trench 34 and is recessed to lower its upper surface 92 to within the upper portion 64 of the trench 34. In an exemplary embodiment, the metal 90 is deposited by CVD to create an overburden above the trench 34 that is removed by a planarization process. The metal 90 is then anisotropically etched with any suitable conventional plasma dry etch chemistry selective to the metal forming the metal 90.

As shown, the metal 90 is deposited in the trench 34 with no voids, as the profile of the trench 34 bounded by the substitute spacer 86 provides a sufficiently low aspect ratio to inhibit void formation. An exemplary metal 90 is a fill metal. As described above, an exemplary fill metal includes metals that may be planarized easily, such as tungsten (with a thin TiN barrier layer), aluminum, copper, or another low resistivity metal.

Figure 16:
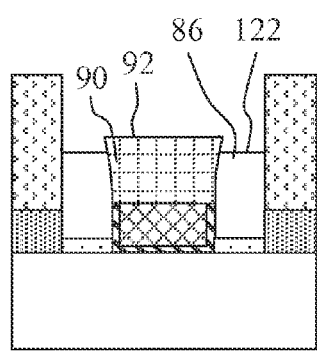

FIG. 16 illustrates an optional step of recessing the substitute spacers 86 such that they have an upper surface 122 that is lower than the upper surface 92 of the metal 90. This optional step may be performed when the substitute spacers 86 are not sufficiently resistant to an etching process for forming a self-aligned contact to the metal 90 in later processing. In embodiments where the substitute spacers 86 are sufficiently resistant to later etching process, the substitute spacers 86 may remain non-recessed.

Figure 17:
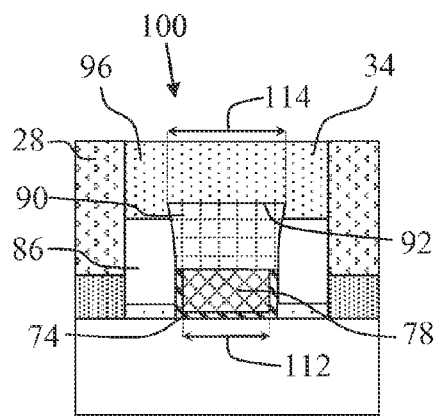

In FIG. 17, a capping material is deposited over the metal 90, substitute spacers 86, and interlayer dielectric material 28 to fill the trench 34 and create an overburden that is removed by planarization to form a cap 96. An exemplary cap 96 is formed from silicon nitride, though any appropriate material that can insulate the metal 90 and provide sufficient resistance to later etching processes in the trench 34 may be used. After forming the cap 96, the fabrication process may continue by performing well known contact formation steps and back-end-of-line (BEOL) process steps to complete the integrated circuit in a conventional manner.

As set forth above, and as partially shown in FIG. 17, a portion of an integrated circuit 10 is provided. The portion of the integrated circuit 10 includes a metal gate electrode structure 100 including the metal 78 and the metal 90. An exemplary metal 78 is a workfunction metal and an exemplary metal 90 is a fill metal with lower resistance. The integrated circuit 10 further includes substitute spacers 86 surrounding the metal gate electrode structure 100. The integrated circuit 10 also includes a high-k dielectric material 74 positioned between at least the metal 78 and the substitute spacers 86. As shown, the metal 78 has a substantially uniform width, indicated by double-headed arrow 112, while the metal 90 has an upwardly expanding width that reaches a maximum width, indicated by double-headed arrow 114, at the upper surface 92.

While embodiments illustrated herein discuss use of a single metal 78, it is contemplated that the metal 78 may include more than one layer of different or alternating metals, such as more than one workfunction metal, and that the method may include multiple deposition steps for forming the metal 78 in the trench 34.

The integrated circuits and methods for fabricating integrated circuits described herein provide metal gate electrode structures that are substantially free of voids. As described above, the aspect ratio of the trench, the reduced width of the lower portion of the trench, and the increased width and tapered shape of the upper portion of the trench, defined by the spacers surrounding the trench during various metal deposition processes, provide for optimal filling of the trench with the deposited metals. As a result, voids, increased resistivity, and gate failures are avoided in the metal gate electrodes formed herein.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:
providing a sacrificial gate structure over a semiconductor substrate, wherein the sacrificial gate structure includes two spacers having upper regions bounding an upper gate space and lower regions bounding a lower gate space, and wherein the sacrificial gate structure includes sacrificial gate material between the two spacers;
recessing a portion of the sacrificial gate material between the two spacers;
etching the upper regions of the two spacers while using the sacrificial gate material as a mask and defining a widened upper gate space;
removing a remaining portion of the sacrificial gate material and exposing the lower regions of the two spacers;
filling the lower gate space with a first metal; and
depositing a second metal in the widened upper gate space.

2. The method of claim 1 wherein providing the sacrificial gate structure over the semiconductor substrate comprises providing the sacrificial gate structure including a hard mask over the sacrificial gate material and between the spacers, and wherein the method further comprises removing the hard mask and a portion of the spacers by planarization before recessing the portion of the sacrificial gate material between the two spacers.

3. The method of claim 1 wherein providing the sacrificial gate structure over the semiconductor substrate comprises providing the sacrificial gate structure including a hard mask over the sacrificial gate material and between the spacers, and wherein the method further comprises:
depositing a dielectric material over the sacrificial gate structure and the semiconductor substrate; and removing the hard mask, a portion of the spacers, and a portion of the dielectric material by planarization before recessing a portion of the sacrificial gate material between the two spacers.

4. The method of claim 1 further comprising forming a cap over the second metal between the upper regions of the two spacers.

5. The method of claim 1 further comprising forming a high-k dielectric layer over the lower regions of the two spacers and over the semiconductor substrate between the two spacers after removing the remaining portion of the sacrificial gate material and exposing the lower regions of the two spacers, wherein filling the lower gate space with the first metal comprises depositing the first metal over the high-k dielectric layer.

6. The method of claim 1 wherein the two spacers are two first spacers, and wherein the method further comprises forming second spacers adjacent the upper regions of the two first spacers after filling the lower gate space with the first metal.

7. The method of claim 6 wherein forming second spacers adjacent the upper regions of the two first spacers comprises forming the second spacers after etching the upper regions of the two spacers.

8. The method of claim 1 wherein the two spacers are two first spacers, and wherein the method further comprises:
   removing the two first spacers after filling the lower gate space with the first metal; and
   forming two second spacers having lower regions adjacent the first metal, wherein the two second spacers have upper regions bounding an upper portion of a trench having an upwardly expanding width, wherein depositing the second metal in the widened upper gate space comprises depositing the second metal between the upper regions of the two second spacers.

9. The method of claim 8 further comprising recessing the two second spacers to a depth below an upper surface of the second metal after depositing the second metal between the upper regions of the two spacers.

10. The method of claim 1 wherein filling the lower gate space with the first metal comprises depositing a workfunction metal between the lower regions of the two spacers, and wherein depositing the second metal in the widened upper gate space comprises filling the widened upper gate space with a fill metal.

11. The method of claim 1 wherein the two spacers are two first spacers, and wherein the method further comprises:
   removing the two first spacers after filling the lower gate space with the first metal; and
   forming two second spacers having lower regions adjacent the first metal, wherein the two second spacers have upper regions bounding the upper widened gate space.

12. The method of claim 11 further comprising recessing the two second spacers to a depth below an upper surface of the second metal after depositing the second metal in the widened upper gate space.

13. The method of claim 12 further comprising forming a cap over the second metal and the two second spacers.

14. The method of claim 1 wherein filling the lower gate space with the first metal comprises depositing the first metal along the upper regions of the two spacers, wherein the first metal defines a void in the upper gate space, and wherein the method further comprises removing the first metal from the upper gate space.

15. A method for fabricating an integrated circuit, the method comprising:
   forming two first spacers over a semiconductor substrate, wherein the two spacers bound a trench having a lower portion, an upper portion, a boundary between the lower portion and the upper portion, and a top; wherein the lower portion has a first width, the upper portion has a second width at the boundary greater than the first width, and the upper portion has an increasing width from the boundary to the top, and wherein each first spacer has an upper region corresponding to the upper portion of the trench;
   depositing a first metal in the lower portion of the trench;
   forming a second spacer adjacent the upper region of each first spacer to provide the upper portion of the trench with a reduced width after depositing the first metal in the lower portion of the trench; and
   depositing a second metal in the upper portion of the trench.

16. The method of claim 15 further comprising forming a cap over the second metal in the upper portion of the trench.

17. The method of claim 15 further comprising forming a high-k dielectric layer in the trench, wherein depositing a first metal in the lower portion of the trench comprises depositing a first metal over the high-k dielectric layer.

18. The method of claim 15 further comprising:
   forming a sacrificial gate over the semiconductor substrate before forming the two spacers;
   recessing a first portion of the sacrificial gate to expose sidewalls of the two spacers, wherein forming two spacers over a semiconductor substrate comprises etching the two spacers using the sacrificial gate as a mask; and
   removing a remaining portion of the sacrificial gate to form the trench between the two first spacers after etching the two first spacers.

19. The method of claim 15 wherein forming the second spacer adjacent the upper region of each first spacer comprises providing the upper portion of the trench with a reduced width at the boundary substantially the same as the first width, and wherein the reduced width increases from the boundary to the top of the trench.

20. An integrated circuit comprising:
   a semiconductor substrate;
   first spacers overlying the semiconductor substrate and having base portions with inner surfaces distanced from one another by a first distance and upper portions having inner surfaces distanced from one another by a second distance greater than the first distance;
   second spacers overlying the base portions of the first spacers and adjacent the upper portions of the first spacers; and
   a metal gate electrode structure overlying the semiconductor substrate and including a workfunction metal between the base portions of the first spacers and a fill metal overlying the workfunction metal and between the second spacers.

* * * * *